(12) United States Patent  (10) Patent No.: US 8,130,177 B2
Nakatani et al.  (45) Date of Patent: Mar. 6, 2012

(54) ORGANIC EL DISPLAY PANEL AND MANUFACTURING METHOD THEREOF

(75) Inventors: Shuhei Nakatani, Osaka (JP); Kiyohiko Takagi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/677,889

(22) PCT Filed: Feb. 10, 2009

(86) PCT No.: PCT/JP2009/000538
§ 371 (c)(1),
(2), (4) Date: Mar. 12, 2010

(87) PCT Pub. No.: WO2009/113239
PCT Pub. Date: Sep. 17, 2009

(65) Prior Publication Data
US 2010/0289728 A1  Nov. 18, 2010

(30) Foreign Application Priority Data
Mar. 13, 2008  (JP) .................................. 2008-064818

(51) Int. Cl.
*G09G 3/30* (2006.01)
(52) U.S. Cl. ............................ 345/76; 313/498; 313/506
(58) Field of Classification Search .............. 345/76–81; 313/498–512; 425/24; 445/24
See application file for complete search history.

(56) References Cited

U.S. PATENT DOCUMENTS

| 7,294,856 | B2 * | 11/2007 | Ito et al. ........................... 257/72 |
| 2002/0016031 | A1 * | 2/2002 | Fujimori et al. .............. 438/200 |
| 2002/0116031 | A1 | 8/2002 | Vonk |
| 2002/0195969 | A1 | 12/2002 | Kimura |
| 2003/0203643 | A1 * | 10/2003 | Hasei et al. .................... 438/758 |
| 2003/0211643 | A1 | 11/2003 | Fujimori et al. |
| 2004/0061921 | A1 * | 4/2004 | Kawai et al. ................... 359/265 |
| 2005/0057152 | A1 | 3/2005 | Park |
| 2005/0093432 | A1 * | 5/2005 | Yamazaki et al. ............ 313/503 |
| 2005/0116632 | A1 * | 6/2005 | Funamoto et al. ............ 313/506 |

(Continued)

FOREIGN PATENT DOCUMENTS

JP  2002-237383  8/2002

(Continued)

OTHER PUBLICATIONS

International Search Report that issued with respect to PCT/JP2009/000538, mailed Mar. 10, 2009.

(Continued)

*Primary Examiner* — Amare Mengistu
*Assistant Examiner* — Dmitriy Bolotin
(74) *Attorney, Agent, or Firm* — Greenblum & Bernstein, P.L.C.

(57) ABSTRACT

Provided is a technique which easily forms a bank the inner lateral surface of which has a part (lower part of the inner lateral surface) made to be lyophilic. The technique provides an organic EL display panel containing a plurality of organic EL elements in which each organic EL element comprises a substrate, an anode disposed on the substrate, an organic light emitting layer disposed on the anode, a cathode disposed on the organic light emitting layer, and a forward-tapered bank which regulates the area of the organic light emitting layer. A lyophobic organic film is disposed on the upper surface of the bank and the surface of the upper part of the tapered portion of the bank but not disposed on the surface of the lower part of the tapered portion of the bank of the organic EL element.

10 Claims, 5 Drawing Sheets

U.S. PATENT DOCUMENTS

| | | | |
|---|---|---|---|
| 2005/0168140 A1 | 8/2005 | Nakamura et al. | |
| 2005/0200273 A1* | 9/2005 | Nozawa | 313/503 |
| 2006/0017038 A1 | 1/2006 | Hasenzahl et al. | |
| 2007/0071885 A1 | 3/2007 | Kumagai | |
| 2007/0264814 A1* | 11/2007 | Hirai et al. | 438/617 |
| 2008/0290789 A1* | 11/2008 | Kai et al. | 313/504 |

FOREIGN PATENT DOCUMENTS

| | | |
|---|---|---|
| JP | 2004-171007 | 6/2004 |
| JP | 2005-326799 | 11/2005 |
| JP | 2006-073222 | 3/2006 |
| JP | 2006-188487 | 7/2006 |
| JP | 2006-216297 | 8/2006 |
| JP | 2007/0005056 | 1/2007 |
| JP | 2007-005056 | 1/2007 |
| JP | 2007-095512 | 4/2007 |
| JP | 2007-324033 | 12/2007 |

OTHER PUBLICATIONS

Search report from E.P.O. that issued with respect to patent family member European Patent Application No. 09719875.8 on Feb. 15, 2011.

* cited by examiner

ORGANIC EL DISPLAY PANEL AND MANUFACTURING METHOD THEREOF

TECHNICAL FIELD

The present invention relates to an organic EL display panel and a manufacturing method of the same.

BACKGROUND ART

An organic EL display panel includes a plurality of organic EL devices formed on a substrate, each of which typically includes a pair of electrodes consisting of pixel electrode (anode) and a cathode, and functional layers such as an organic emitting layer between the electrodes. The electrodes and functional layers are generally formed by vapor deposition, sputtering or other method, but can also be formed by coating method.

Formation of the electrodes and functional layers by coating method involves application and drying of liquid substances in regions defined by bank made of insulating material. Failure to appropriately control the bank's surface affinity for the liquid substances often leads to low uniformity in the resultant layer's thickness. This in turn leads to poor image characteristics in the manufactured organic EL display panel due in part to brightness unevenness.

In general, the bank top surface needs to be lyophobic in order for the applied liquid substance to be retained in the region defined by the bank. However, when the bank inner side surface is lyophobic, the applied liquid substance fails to spread to the desired region, which results in low uniformity in the resultant layer's thickness. Accordingly, a lower side of the bank inner side surface of the bank is preferably lyophilic, while a upper side of the inner side surface of the bank is lyophobic.

To achieve this, two-layered banks have been reported in which the lower layer is made lyophilic and the upper one is made lyophobic (see Patent Documents 1 to 5). For example, these literatures describe supplying liquid substances in regions defined by two-layered bank consisting of a lower layer made of inorganic material and a upper layer made of organic material or the like, to form therein functional layers such as an organic emitting layer. Moreover, techniques have also been known that form a lyophobic organic film only on the upper layer of the two-layered bank (see Patent Documents 6 and 7).

Further, methods of selective modification of surface properties by light radiation of a thin organic film formed on the surface are known (see, e.g., Patent Document 8). Such a thin organic film is sometimes referred to as a "self-assembled thin organic film." For example, self-assembled thin organic films are known that undergo molecular structure changes on exposure to UV light to alter the water contact angle at the exposed surface.

Techniques have been known that form self-assembled thin organic films on bank surrounding coating region in which functional layer is to be formed by a coating method (see Patent Documents 9 and 10). Patent Document 9 reports a method of photo-patterning of a lyophobic, self-assembled thin organic film provided over entire surface of partitioning wall (bank) in such a way that the self-assembled thin organic film exclusively remains on the bank top surfaces.

Patent Document 1: Japanese Patent Application Laid-Open No. 2004-171007
Patent Document 2: Japanese Patent Application Laid-Open No. 2005-326799
Patent Document 3: U.S. Patent Application Publication No. 2005/0116632
Patent Document 4: Japanese Patent Application Laid-Open No. 2006-216297
Patent Document 5: U.S. Patent Application Publication No. 2006/017038
Patent Document 6: Japanese Patent Application Laid-Open No. 2007-95512
Patent Document 7: U.S. Patent Application Publication No. 2007/0071885
Patent Document 8: Japanese Patent Application Laid-Open No. 2006-188487
Patent Document 9: Japanese Patent Application Laid-Open No. 2002-237383
Patent Document 10: U.S. Patent Application Publication No. 2002/0016031

DISCLOSURE OF INVENTION

Problems to be Solved by the Invention

As described above, it is expected that a uniform thick coating film can be obtained by making a lower portion of the bank side wall lyophilic and making a upper portion of the bank side wall lyophobic. Thus, the present invention provides a means that allows precise and full control of the boundary between the lyophilic and lyophobic areas and thereby provides a means of forming uniform thick coating films in regions defined by bank.

In the case of a two-layered bank composed of a lower layer made of inorganic material and a upper layer made of organic material, the size of a lyophilic area has been adjusted by adjusting the thickness of the lower layer. Formation of an excessively thick inorganic lower layer, however, takes longer deposition time; moreover, over-etching is more likely to occur when etching such an excessively thick film. Furthermore, over-etching may damage other members provided underneath the inorganic lower layer.

In view of the foregoing circumstances, the present invention thus enables easy and precise formation of bank whose inner side surface is partially made lyophilic (at a lower portion of the inner side surface). Moreover, coating film thickness is further uniformed by tapering the bank which define a coating region. The present invention thus provides an organic EL display panel with less brightness unevenness by uniformly forming functional layers such as an organic emitting layer in a region defined by bank in respective organic EL devices. The present invention also provides an organic TFT with a highly uniform organic semiconductor layer.

Means for Solving the Problem

A first aspect of the present invention relates to organic EL display panels described below.

[1] An organic EL display panel including a plurality of organic EL devices each including:
   a substrate;
   an anode formed over the substrate;
   an organic emitting layer formed over the anode;
   a cathode formed over the organic emitting layer;
   a forward tapered bank defining a region for the organic emitting layer, the bank having a top surface and an inclined side surface; and
   a lyophobic organic film formed on the top surface of the bank and the upper portion of an inclined side surface of the bank, wherein a lower portion of the inclined side surface of the bank includes no lyophobic organic film.

[2] The organic EL display panel according to [1], wherein the forward tapered bank has a taper angle of 20° to 70°.

[3] The organic EL display panel according to [1], wherein the organic emitting layer is formed by a coating method, and a contact point between a surface of the organic emitting layer and the inclined side surface of the bank is defined by the lyophobic organic film.

[4] The organic EL display panel according to [1], wherein the lyophobic organic film formed on the bank surface is a self-assembled film.

[5] The organic EL display panel according to [1], wherein the lyophobic organic film formed on the bank surface is a monolayer film.

[6] The organic EL display panel according to [1], further including a lyophilic organic film formed on the lower portion of the inclined side surface of the bank.

[7] The organic EL display panel according to [1], wherein the bank is made of inorganic insulating material.

[8] The organic EL display panel according to [1], wherein the bank is made of organic insulating material.

[9] The organic EL display panel according to [1], wherein the bank is a linear bank.

A second aspect of the present invention relates to manufacturing methods of an organic EL display panel described below.

[10] A method of manufacturing an organic EL display panel including:

providing a substrate having a plurality of anodes formed thereon;

forming a forward tapered bank having a top surface and an inclined side surface so as to surround at least a part of the anode;

forming a lyophobic organic film over a surface of the bank;

exposing the lyophobic organic film at a lower portion of the inclined side surface of the bank so as to reduce the lyophobicity of the exposed portion of the lyophobic organic film or remove the exposed portion of the lyophobic organic film;

applying an ink containing organic luminescent material in a region defined by the bank to form therein an organic emitting layer; and forming a cathode over the organic emitting layer.

[11] The method according to [10], wherein the forward tapered bank has a taper angle of 20° to 70°.

[12] The method according to [10], wherein the lyophobic organic film is a lyophobic, photosensitive self-assembled film.

[13] The method according to [10], wherein irradiation light used for the exposure is UV light.

[14] The method according to [10], further including forming a hole injection layer over the anode prior to the bank formation step.

A third aspect of the present invention relates to an organic thin film transistor described below.

An organic thin film transistor including:

a substrate;

a source electrode and a drain electrode which are formed on the substrate;

an organic semiconductor film for connecting the source electrode and the drain electrode together;

a forward tapered bank defining a region for the organic semiconductor film, the bank having a top surface and an inclined side surface; and a gate electrode connected to the organic semiconductor film via an insulating film, wherein a lyophobic organic film is formed on the top surface of the bank and a upper portion of the inclined side surface of the bank, and a lower portion of the inclined side surface of the bank includes no lyophobic organic film.

Advantageous Effect of the Invention

With the present invention it is made easy to prepare bank whose inner side surface is partially made lyophilic or lyophobic as well as to freely control the positions of the lyophilic area and lyophobic area. It is thus possible to form a highly uniform functional layer by a coating method in a region defined by a bank without being influenced by properties (e.g., viscosity) of the liquid substance to be applied therein. In particular, when the bank is forwardly tapered, i.e., the bank inner side surfaces are inclined, the functional layer with much higher uniformity can be formed by a coating method.

BRIEF DESCRIPTION OF DRAWINGS

FIGS. 1A and 1B are schematic views showing a lamination of elements of an organic EL device.

BEST MODE FOR CARRYING OUT THE INVENTION

1. Organic EL Display Panel

An organic EL display panel of the present invention includes a plurality of organic EL devices, which are typically arranged in a matrix arrangement. Each organic EL device includes 1) a substrate, 2) a pixel electrode (anode), 3) a functional layer such as an organic emitting layer, 4) a cathode, 5) a forward tapered bank, and 6) a lyophobic organic film provided on the tapered bank so as to cover its top surface and upper portion of inner side surface (also referred to as "upper portion of the inclined side surface").

Materials of the substrate are not specifically limited, but are preferably insulating. Examples include glass, polyethylene terephthalate (PET), polyethylene naphthalate (PEN), and polyimide (PI). When manufacturing a bottom-emission type organic EL display panel, the substrate also needs to be highly transparent to visible light.

The substrate has a plurality of pixel electrodes on its surface, which are typically arranged in a matrix arrangement. The pixel electrodes preferably serve as anodes. Preferably, the pixel electrodes are each connected to the source electrode or drain electrode of respective driving TFTs, for example.

When manufacturing a top-emission type organic EL display panel, the pixel electrodes require light reflectivity. Examples of materials of light-reflective pixel electrodes include silver-palladium-copper (APC) alloys, silver-rubidium-gold (ARA) alloys, molybdenum-chrome (MoCr) alloys, and nickel-chrome (NiCr) alloys.

On the other hand, when manufacturing a bottom-emission type organic EL display panel, the substrate and pixel electrode both require light transparency. Thus, the organic EL display panel is preferably manufactured by preparing a substrate made of glass, PET, PEN or the like and providing thereon anodes made of ITO, indium zinc oxide (IZO), tin oxide or the like.

The organic EL device includes a functional layer which covers at least a part of the pixel electrode on the substrate. Functional materials used for the functional layer may be either low-molecular materials or polymer materials, but are preferably polymer materials. Polymer material-containing ink can be applied to the region defined by the bank (later described) relatively easily and thus is suitable for use in an organic EL display panel of the present invention. In particular, the organic emitting layer is preferably made of polymeric organic material. As will be described later, preferably, ink containing functional material is applied to the region defined by the bank by inkjet printing, dispensing, nozzle coating, spin coating, intaglio printing, relief printing, etc., and dried to form layer therein.

The functional layer prepared by a coating method encompasses at least an organic emitting layer, and may also encompass a hole injection layer, an interlayer, an electron transport layer, etc. These layers are stacked over the pixel electrode.

Examples of organic luminescent materials for the organic emitting layer include polyphenylenevinylene and derivatives thereof, polyacetylene and derivatives thereof, polyphenylene and derivatives thereof, poly(para-phenylene ethylene) and derivatives thereof, poly3-hexylthiophene and derivatives thereof, and polyfluorene and derivatives thereof.

The hole injection layer has the function of enhancing the injection efficiency of holes from the pixel electrode. Examples of organic materials of the hole injection layer include poly(ethylenedioxythiophene) doped with poly(styrene sulfonate) (PEDOT-PSS), poly(3,4-ethylenedioxythiophene) and derivatives thereof.

The interlayer has the function of preventing electrons from being transported to the hole injection layer from the organic emitting layer as well as efficiently transporting holes to the organic functional layer. Examples of materials of the interlayer include triphenylamine and polyaniline.

The electron injection layer transports electrons, which have been injected from the cathode, to the organic emitting layer. Examples of materials of the electron injection layer include barium, phthalocyanine, lithium fluoride, and combinations thereof.

A cathode is formed over the functional layer, preferably over the electron transport layer. Materials of the cathode for a bottom-emission type organic EL display panel are not particularly limited as long as they are light reflective; for example, the cathode is formed of an aluminum layer. In the case of a top-emission type organic EL display panel, materials that easily transmit visible light may suffice; for example, an ITO film or the like may be employed.

The organic EL device may further include a sealing film provided on the cathode. The sealing film prevents the functional layer of the organic EL device from being exposed to moisture and air.

Each of the organic EL devices in a organic EL display panel of the present invention includes bank defining a region in which the electrode or functional layer is provided. Preferably, the bank provided on the hole injection layer defines the region for the functional layer (except hole injection layer) (see FIG. 1A). Alternatively, the bank provided on the pixel electrode defines the region for the functional layer (see FIG. 1B).

The bank may be either pixel bank or linear bank, but is preferably linear bank. The term "pixel bank" refers to a bank which defines a functional layer region for each organic EL device. The term "linear bank" refers to a bank defining a functional layer of the organic EL devices aligned in a row; therefore, in the case of linear bank, the organic EL devices aligned in a row share one functional layer.

In the case of pixel bank, coating is conducted by dropping ink droplets for each region defined by the bank. In the case of linear bank, on the other hand, coating is facilitated because ink droplets can be continuously applied in the region defined by the linear bank. With this linear coating method, not only productivity increases, but also uniformity in the thickness of the resultant functional layers improves. Functional layers prepared by coating methods generally tend to have increased thickness near the bank. Accordingly, with the pixel bank configuration where the functional layer is entirely surrounded by bank, the functional layer exhibits non-uniform thickness at their periphery. With the linear bank configuration, by contrast, uniform functional layer thickness can be readily obtained because the functional layer region is free of any bank in the direction in which pixels are aligned in a row.

It is only necessary for the bank to be made of insulating material. The bank preferably has resistance to organic solvent as well as is capable of transmitting some visible light. Moreover, because the bank may be subjected to etching treatment, baking treatment or the like, it is preferably made of such material that exhibits high resistance to those treatments. Materials for the bank may be organic materials such as resin or inorganic materials such as glass. Examples of organic materials include acrylic resins, polyimide resins, and novolac phenol resins. Examples of inorganic materials include silicon oxide ($SiO_2$) and silicon nitride ($Si_3N_4$).

The bank is preferably forward tapered and has a top surface and an inclined side surface. The inclination angle of the inclined side surface (bank taper angle) is not specifically limited, but is preferably 20° to less than 90°, more preferably 20° to 70°, most preferably 30° to 50°. When the bank taper angle is too large, it results in poor sealing ability due to low coverage of films (e.g., sealing film) over the bank, facilitating undesired entry of moisture or the like in the device. When the bank taper angle is too small, it may result in failure to obtain desired functional layers due to limited ink amount to be applied for the functional layer formation.

As described above, a lyophobic organic film formed over the entire surface (including top surface and inclined side surfaces) of the bank is exposed to light at lower portion of the inclined side surface so as to remove or modify the exposed portion of the lyophobic organic film. In order to selectively and precisely expose the lyophobic organic film at lower portion of the inclined side surface of the bank, the bank is preferably forward tapered, with the taper angle preferably ranging from 20° to 70°.

The bank height is not specifically limited, but is about 0.3 to 3 μm.

The bank is preferably lyophobic at its top surfaces because the ink applied to the region defined by bank may leak beyond the bank top surface. The bank is characterized in that its inclined side surface is partially lyophobic and lyophilic. More specifically, the inclined side surface is lyophilic at a lower portion and is lyophobic at an upper portion.

Herein, the terms "lyophobic" and "lyophilic" are used in a relative sense; it is only necessary that the inclined side surface be more lyophobic at a upper portion than at a lower portion. Preferably, the term "lyophobic" means that a droplet of water-based ink to be applied for the functional layer formation has a contact angle of 80° or more, and a droplet of organic solvent-based ink to be applied for the functional layer formation has a contact angle of 40° or more. The term "lyophilic" preferably means that a droplet of organic solvent-based ink has a contact angle of 5° or less.

As described above, the bank top surface and upper portion of the bank inclined side surface are made lyophobic. To establish lyophobicity, it is preferable to provide a lyophobic film, particularly a lyophobic organic film, on the top surface and upper portion of the inclined side surface. Moreover, the lyophobic film preferably is a photosensitivity film that changes from lyophobic to lyophilic on exposure to light. Utilizing this photosensitivity, lower portion of the bank inclined side surface can be made lyophilic.

The lyophobic film is preferably a monolayer film, more preferably a self-assembled monolayer film. The reason for this is that monolayer film has less influence on the functional layer to be formed in the region defined by the bank. A self-assembled layer is a monolayer of chain molecules in which one end of the molecules has a functional group showing a specific affinity to the substrate. More specifically, the self-assembled layer is prepared by the chemisorption of the functional groups onto a substrate from either the vapor or liquid phase, so that the functional groups form bonds with the atoms of the substrate surface. This monolayer film is referred to as a self-assembled film as it is formed by the self-chemisorption of molecules onto a substrate.

A self-assembled film that changes from lyophobic to lyophilic on exposure to light may be prepared using the technique disclosed by Patent Document 8. More specifically, a self-assembled film is prepared by coating a substrate with a solution of phenylsulfone bearing a functional group which can interact with the substrate (silyl group) and by drying the solution. The obtained film is lyophobic, but is made lyophilic on exposure to UV light by the molecular structure change.

Similarly, a self-assembled film that changes from lyophobic to lyophilic on exposure to light may be prepared using the technique disclosed by Japanese Patent Application Laid-Open No. 2007-246418. More specifically, a self-assembled film is prepared by coating a substrate with a solution of a compound bearing a functional group which can interact with the substrate (silyl group) and a secondary amine capped with o-nitrobenzyloxycarbonyl group and by drying the solution. The obtained film is lyophobic, but is made lyophilic on exposure to UV light by the molecular structure change. An organic coating film may also be prepared which is disclosed by Japanese Patent Application Laid-Open No. 2006-168606.

Alternatively, a lyophobic organic thin film (e.g., a self-assembled film made of fluoroalkylsilane) may be formed using the technique disclosed by Japanese Patent Application Laid-Open No. 2007-134348. This lyophobic organic thin film is ablated by irradiation with light, thereby exposing the substrate.

Any one of these lyophobic self-assembled films is formed, which is then partially exposed to light at selected portion, so that the exposed portion is made lyophilic.

Figure 1A:
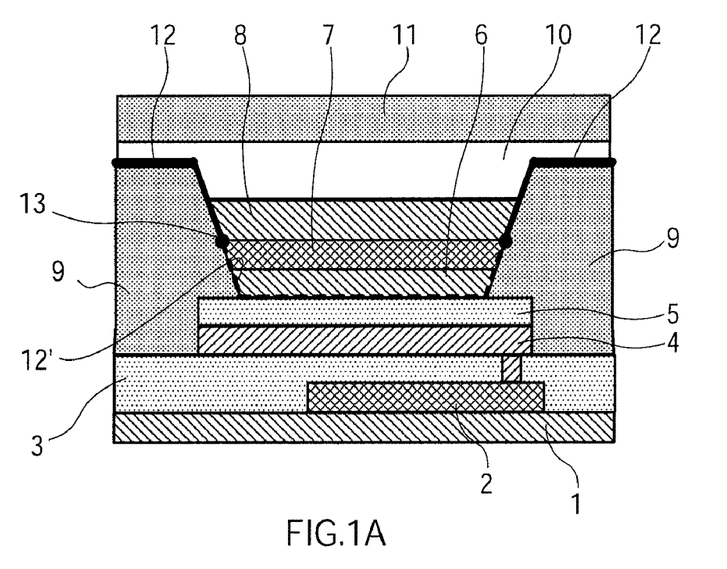
FIG. 1A shows an example where a hole injection layer is not defined by the bank.
Figure 1B:
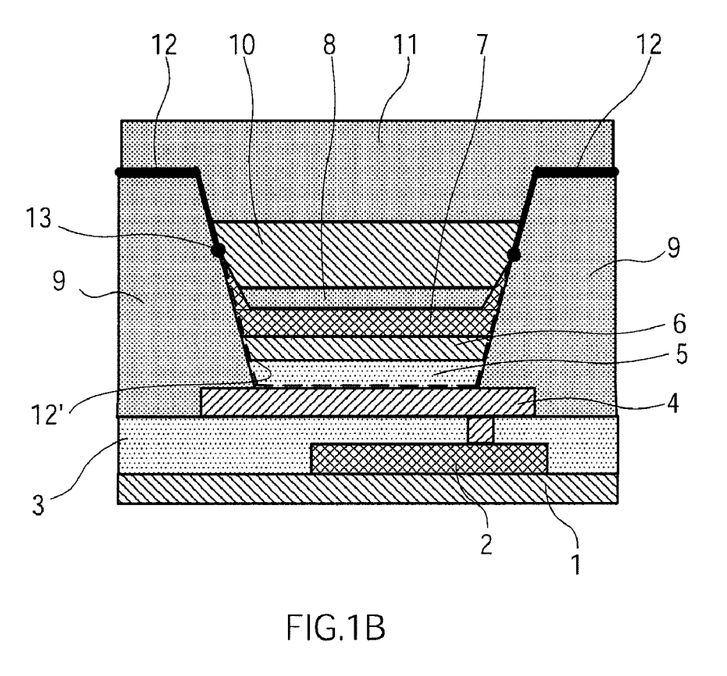
FIG. 1B shows an example where a hole injection layer is defined by the bank.

FIGS. 1A and 1B each show an example of an organic EL device in an organic EL display panel of the present invention. The organic EL devices of FIGS. 1A and 1B are each placed over a driving TFT because they are intended for use in a top-emission type organic EL display panel. It is, of course, possible to apply the present invention to a bottom-emission type organic EL display panel; in this case, driving TFTs may be formed on the same plane as organic EL devices.

FIG. 1A shows an organic EL device arranged on planarizing film 3 covering substrate 1 in which TFT 2 is provided. More specifically, reflective anode 4 (pixel electrode) is arranged on planarizing film 3, and hole injection layer 5 is arranged on reflective anode 4. Reflective anode 4 (pixel electrode) is connected to the drain electrode (not shown) of TFT 2.

Forward tapered bank 9 is formed surrounding hole injection layer 5. Bank 9 partially overlaps hole injection layer 5. In the region defined by bank 9, interlayer 6, emitting layer 7, and electron injection layer 8 are sequentially laminated. Among these layers, it is preferable that at least emitting layer 7 be prepared by a coating method. Cathode 10 and sealing film 11 are further laminated. Cathode 10 and sealing film 11 may be connected to adjacent organic EL devices beyond bank 9. Similarly, electron transport layer 8 may be connected to adjacent organic EL devices beyond bank 9.

FIG. 1B also shows an organic EL device arranged on planarizing film 3 covering substrate 1 in which TFT 2 is provided. Bank 9 is formed surrounding reflective anode 4 (pixel electrode) arranged on planarizing film 3. Bank 9 partially overlaps reflective anode 4. In the region defined by bank 9, hole injection layer 5, interlayer 6, emitting layer 7, and electron injection layer 8 are sequentially laminated. Among these layers, it is preferable that at least emitting layer 7 be prepared by a coating method. Cathode 10 and sealing film 11 are further laminated.

Bank 9 may be either pixel bank or linear bank. A pixel bank completely surrounds respective pixel electrode to define separate pixel. On the other hand, a linear bank defines rows of pixels; it partially surrounds pixel electrodes. More specifically, linear bank defines a row of pixels of the same color (R, G or B)

In FIGS. 1A and 1B, lyophobic film 12 is formed on bank 9 so as to cover its top surface and a upper portion of its inclined side surface. On the other hand, lyophilic film 12' is preferably formed on a lower portion of the inclined side surface. Lyophobic film 12 or lyophilic film 12' may be decomposed and remain as residues after the device has been manufactured. These residues are also defined as lyophobic film 12 or lyophilic film 12'.

The position at which a droplet of ink (ink for an emitting layer is employed herein) applied in a region defined by the bank shows "self-pinning" when it has reached the critical concentration during drying is herein referred to as "pinning point" 13. As will be described later, the position of the pinning point can be controlled by adjustment of the boundary between the lyophobic film area and lyophilic film area. It is thus possible to provide uniform thick emitting layer 7. Accordingly, the pinning point corresponds to a contact point between a surface of the coated layer (including emitting layer 7) and an inclined side surface of the bank.

Pinning point 13 generally positions above the uniform-thick area of emitting layer 7 (upper portion of the bank). Pinning point 13 often positions at the same level as the surface of the cathode or sealing film laminated on the electron injection layer which is often a ultrathin film of several nanometers in thickness (see FIG. 1B). More specifically, a contact point between a surface of a coated layer (including emitting layer 7) and a bank inclined side surface is often at the same level as the height of the surface of the cathode or sealing film.

There is no need to provide a lyophobic film on a lower portion of the inclined side surface below pinning point 13; rather, it is preferable that no lyophobic film is provided thereon. When the inclined side surface is made entirely lyophobic, it repels ink containing functional layer material at the bank bottom, which may result in failure to cover the edge of the pixel electrode with a functional layer. This may cause a short circuit between the cathode and anode.

Figure 2:
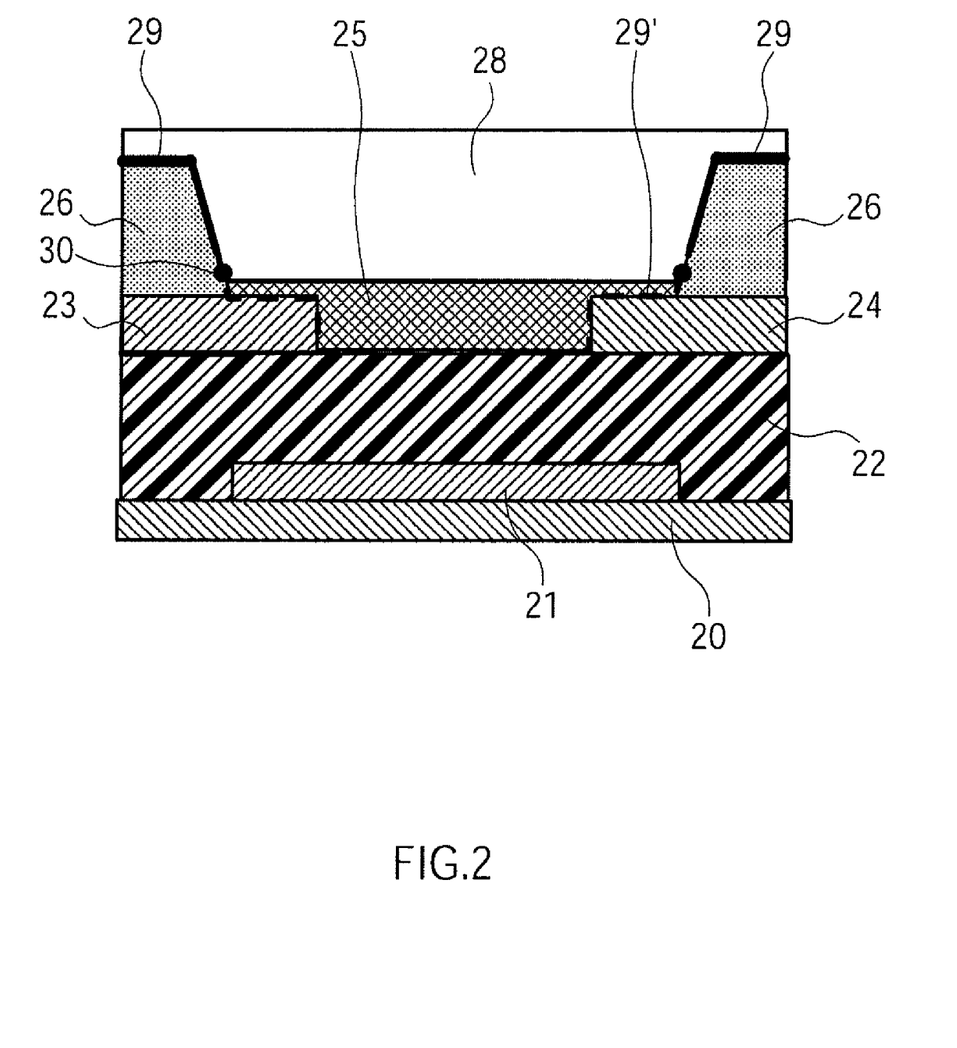
FIG. 2 is a schematic view showing a lamination of elements of an organic TFT.

The present invention also provide an organic thin film transistor (organic TFT) described below (see FIG. 2). The organic TFT shown in FIG. 2 includes substrate 20; gate electrode arranged on substrate; gate insulating film 22 covering gate electrode 21; source electrode 23 and drain electrode 24 arranged on gate insulating film 22 and a channel region; forward tapered bank respectively covering source electrode 23 and drain electrode 24; organic semiconductor layer 25 arranged in a region defined by bank 26; and overcoat layer 28 covering bank 26 and organic semiconductor layer 25.

Lyophobic film 29 (including decomposed matter in the form of residues) is formed on the top surface and a upper portion of the inclined side surface of bank 26. On the other hand, lyophilic film 12' (including decomposed matter as residues) is preferably formed on a lower portion of the inclined side surface. By adjusting the position of pinning point 30 by adjusting the position of the boundary between the lyophobic film area and lyophilic film area, it is possible to control the thickness and uniformity of the organic semiconductor layer prepared by a coating method.

2. Manufacturing Method of Organic EL Display Panel

A manufacturing method of the organic EL display panel of the present invention includes, for example, the steps of:

1) providing a substrate having a plurality of anodes formed thereon;

2) forming a tapered bank so as to surround at least a part of the anode;

3) forming a lyophobic organic film over a surface of the bank;

4) exposing the lyophobic organic film at a lower portion of an inclined side surface of the bank so as to reduce the lyophobicity of the exposed portion of the lyophobic organic film or remove the exposed portion of the lyophobic organic film;

5) applying ink containing organic luminescent material in a region defined by the bank to form therein an organic emitting layer; and 6) forming a cathode over the organic emitting layer.

Formation of anodes (pixel electrodes) on a substrate can be achieved by vapor deposition, or sputtering, of anode material. Photolithography can also be employed. Anodes are preferably arranged on the substrate in a matrix arrangement or in a linear arrangement.

Hole injection layers may be formed on the anodes arranged on the substrate. The formation method of hole injection layer is not specifically limited.

Tapered bank may be formed by photolithography, for example, as follows: A resin film is applied over the substrate surface provided with anodes and optionally with hole injection layers; the resin film is selectively exposed through a mask; and desired portions of the resin film are developed away. In this way the anodes or hole injection layers arranged on the substrate become exposed at the surface. Alternatively, tapered bank made of inorganic material may be formed by CVD or the like. As described above, the bank may be either pixel bank or linear bank, but is preferably linear bank.

Subsequently, a lyophobic organic film is formed over surfaces of the bank. The lyophobic organic film may be formed not only on the bank surface, but also in the region defined by the bank (anode surface and/or hole injection layer surface). The lyophobic organic film is preferably a photosensitive film that changes from lyophobic to lyophilic on exposure to light due to lyophobicity reduction. Moreover, the lyophobic organic film formed on the bank surface is preferably an organic monolayer film or self-assembled film. The reason for this is that organic monolayer film has less influence on functional layer to be formed in the region defined by the bank.

The method of forming a lyophobic organic film, particularly a self-assemble film, on the bank surface is not specifically limited; for example, a solution containing organic molecules for a lyophobic organic film is applied on the bank surface using a known coating technique, and is dried by heating to prepare a lyophobic organic film. Examples of coating methods include dip coating, spin coating, spray coating, roll coating, Meyer bar coating, screen printing, and brush coating. More specifically, the above-described prior art can be employed.

The lyophobic organic film formed on the bank surface preferably has a property that alters its physical properties on exposure to light. For example, on exposure to UV light, exposed portion of the lyophobic organic film exclusively becomes lyophilic. Alternatively, exposed portion themselves may be ablated. When the exposed portion of the lyophobic organic film is removed, member which have been covered by the lyophobic organic film become exposed at the surface, whereby lyophobicity disappears and thus lyophilicity relatively increases at the exposure site.

Thus, the lyophobic organic film formed on the bank surface is partially exposed to light, to make the lyophobic organic film of the exposed portion be lyophilic. Here, lower portion of the inclined side surface of the bank is exposed to light and thereby made lyophilic. When a lyophobic organic film is also formed in the region defined by the bank, it is preferable that the lyophobic film in this region be also exposed to light.

Figure 3A:
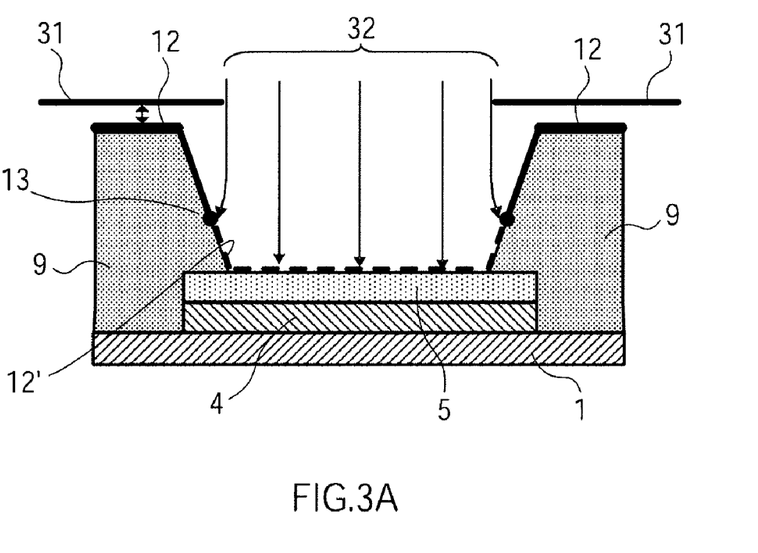
FIGS. 3A and 3B are schematic views demonstrating that when exposing the bank surface through a mask, the exposure area can be controlled by changing the distance between the mask and bank surface.
Figure 3B:
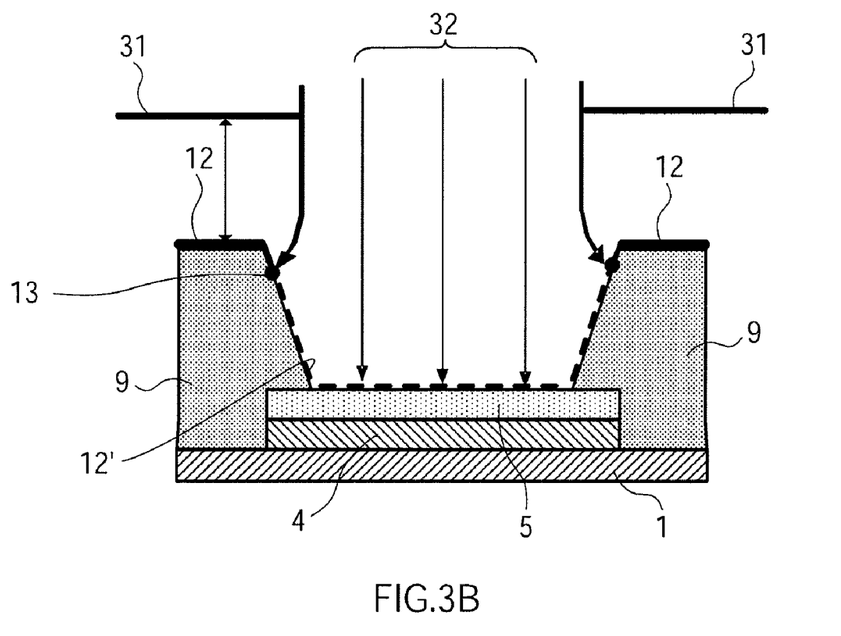

Selective exposure of the lyophobic film formed on the bank surface may be achieved by exposure using a mask. The exposure area may be controlled by adjusting the opening area of the mask or the distance (gap) between the mask and bank surface. Because light 32 passing through the mask opening spreads out as shown in FIGS. 3A and 3B, the exposure area can be made large by widening the distance between mask 31 and bank surface. In FIG. 3A, the distance between mask 31 and bank surface is small compared to that of FIG. 3B. Thus, in FIG. 3B, light 32 spreads out more and, therefore, the exposure area shown in FIG. 3B is larger than that shown in FIG. 3A even though the mask opening is of the same size as that of FIG. 3A.

As described above, lower portion of the inclined side surface of bank is made lyophilic. Preferably, an area to be made lyophilic (area to be exposed to light) is so selected that resulting functional layers, particularly an organic emitting layer, exhibits high uniformity in thickness, because organic emitting layers with high uniformity in thickness effectively contribute to improved image quality, e.g., low brightness unevenness.

The area to be made lyophilic may be appropriately selected depending on 1) bank taper angle; 2) properties (e.g., receding contract angle) of liquid raw material of the functional layer; 3) setting of exclusion area; and so forth, so that resultant functional layers become highly uniform in thickness. A specific setting scheme for this will be described in detail below.

Once lower portion of the inclined side surface of the bank has been made lyophilic, functional layer is formed by a coating method in the region defined by the bank. As described above, the functional layers are preferably formed by applying ink containing functional material by a coating method such as inkjet printing, dispensing, nozzle coating, spin coating, intaglio printing or relief printing and drying the ink applied therein. Thereafter, cathodes and sealing films are sequentially formed. In this way organic EL devices are manufactured.

Setting of Area to be Made Lyophilic

The following describes a non-exclusive method of setting an area of the bank surface to be lyophilic. Herein, the area of the inclined side surface from the bottom to a given height (hereinafter also referred to as "pinning height") is set as an area to be made lyophilic.

Figure 4A:
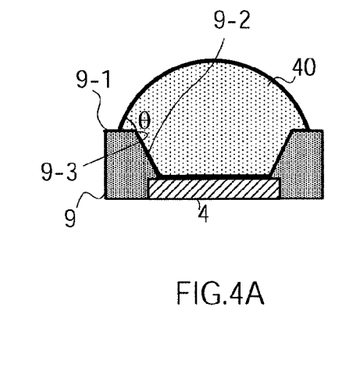
FIGS. 4A to 4F are a process diagram showing how a liquid substance supplied to a region defined by the bank dries.
Figure 4B:
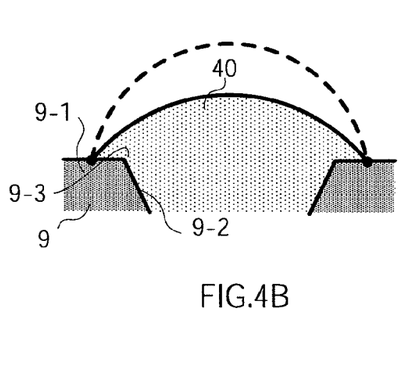

The liquid substance (ink) in the form of droplet 40 supplied to the cavity defined bank 26 has a contact angle of θ with respect to the bank surface (here, top surface 9-1) (FIG. 4A). As droplet 40 dries, contact angle θ decreases (FIG. 4B) to a level equal to receding contact angle $\theta_R$ of the ink. Receding contact angle $\theta_R$ varies depending on ink's properties (e.g., viscosity) as well as on bank surface's physical properties (e.g., surface free energy). Namely, the more lyophobic the bank surface is to ink, the greater receding contact angle $\theta_R$ becomes.

Figure 4C:
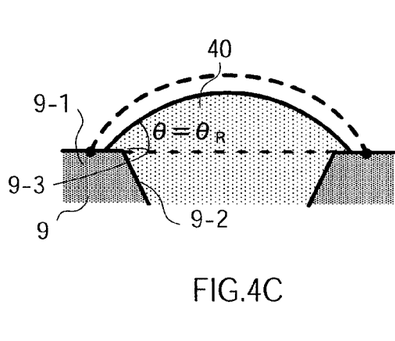
Figure 4D:
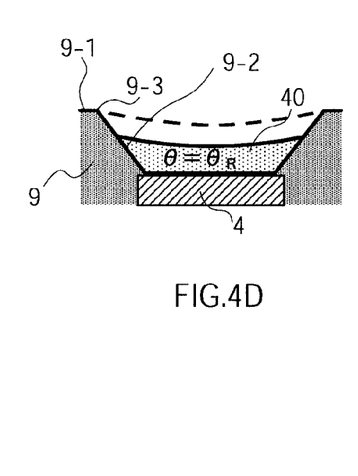
Figure 4E:
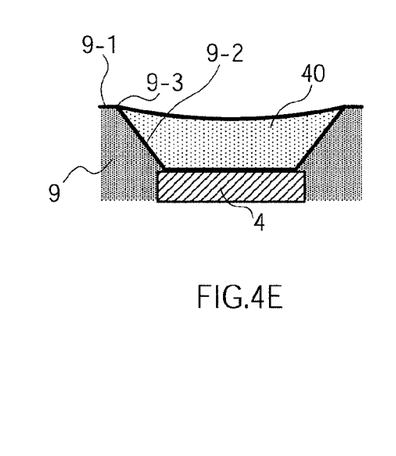
Figure 4F:
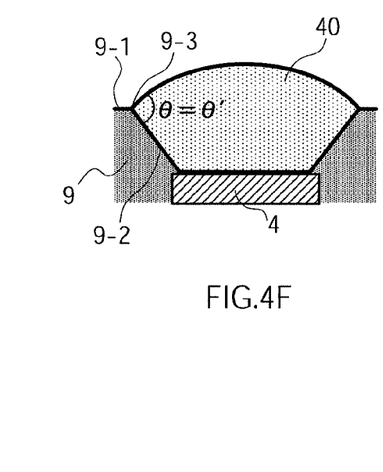

When contact angle θ equals to receding contact angle $\theta_R$, droplet 40 becomes small, and the edge of droplet 40 approaches toward bank edge 9-3 (FIG. 4C). When the edge of droplet 40 has reached bank edge 9-3, contact angle θ of the ink with respect to bank surface (inclined side surface) increases to θ' (FIG. 4D). As the ink further dries, contact angle θ decreases (FIG. 4E). When contact angle θ equals to receding contact angle $\theta_R$, droplet 40 becomes small (FIG. 4F). As the ink dries, ink concentration increases, which result in increasing ink viscosity. Thus, the size of droplet 40 does not change any more, which result in determining the final position of the droplet edge. The above-described droplet edge positioning process is referred to as "pinning." "Pinning" that occurs due to ink concentration increase is particularly referred to as "self pinning."

The present invention is characterized in that "pinning" is controlled by making a lower portion of a bank inclined side surface lyophilic while making a upper portion thereof lyophobic. Specifically, since ink's receding contact angle $\theta_R$ becomes small at a lyophilic bank surface, the ink droplet becomes hard to be small further. Thus, the boundary between the lyophobic area and lyophilic area corresponds to the droplet edge position, thereby enabling "pinning" control.

The following discusses examples where ink's receding contract angles $\theta_R$ are 30° and 40°, respectively, with respect to a lyophilic surface (lower portion of an inner side surface) of a bank.

Figure 5:
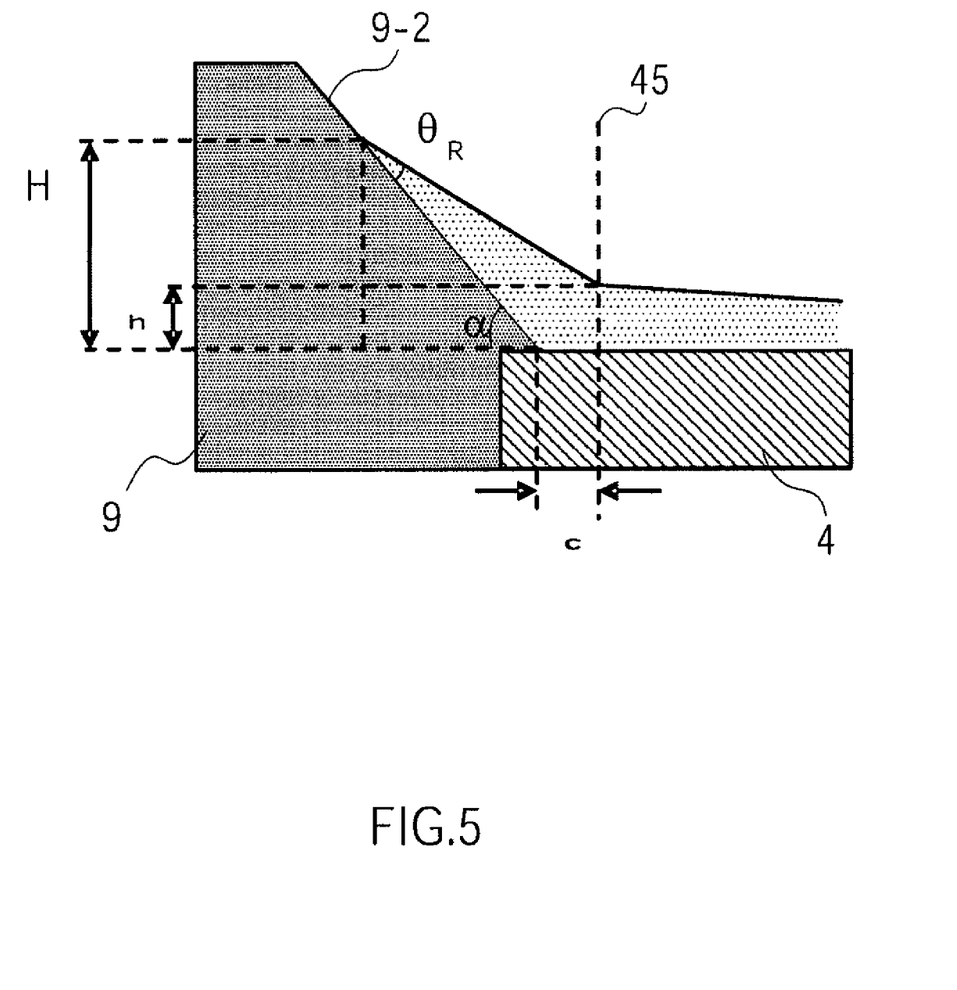
FIG. 5 shows a model for setting pinning height.

Here, a case in which a hole injection layer (HIL), an interlayer (IL), an organic emitting layer (EML)) are sequentially stacked over an anode arranged in a region defined by bank will be taken as example. As shown in FIG. 5, the thicknesses of these layers at effective pixel edge 45 are set as follows: HIL: 65 nm, IL: 20 nm, EML: 85 nm (total height h: 170 nm). As shown in FIG. 5, there is a non-effective pixel area called "exclusion area" between bank 9 and effective pixel edge 45. In this example, the width of the exclusion area from the bank edge is defined as distance c (: 1 μm or 0.5 μm). The bank taper angle α is set to 30° to 90°.

When the height of the lyophilic area in bank tapered surface 9-2 is defined as pinning height H (unit: nm), the following equation holds:

$$h = H - \left(c + \frac{H}{\tan\alpha}\right)\tan(\alpha - \theta_R)$$

Values of pinning height H obtained using the above equation are shown in the table below.

TABLE 1

| Taper angle (α°) | | Ink receding contact angle ($\theta_R = 30°$) | | Ink receding contact angle ($\theta_R = 40°$) | |
|---|---|---|---|---|---|
| | | Exclusion area (c = 1 μm) | Exclusion area (c = 0.5 μm) | Exclusion area (c = 1 μm) | Exclusion area (c = 0.5 μm) |
| Taper angle (α°) | 30[note(1)] | 193 | 184 | — | — |
| | 35 | 293 | 242 | — | — |
| | 40[note(2)] | 438 | 322 | 191 | 182 |
| | 45 | 598 | 416 | 281 | 233 |
| | 50 | 757 | 500 | 400 | 300 |
| | 55 | 940 | 597 | 543 | 376 |
| | 60 | 1120 | 685 | 662 | 438 |
| | 65 | 1298 | 776 | 807 | 512 |
| | 70 | 1463 | 855 | 936 | 576 |
| | 75 | 1602 | 918 | 1060 | 634 |
| | 80 | 1722 | 968 | 1188 | 694 |
| | 85 | 1806 | 1000 | 1281 | 733 |
| | 90[note(3)] | 1886 | 1030 | 1347 | 760 | notes(1)to(3) For convenience of calculation, values of taper angle were set at 31, 41 and 89, respectively.

As described above, pinning height (height of the bank inner side surface to be made lyophilic) is appropriately determined depending on the relationship between ink property and bank surface (ink's receding contact angle) and setting of the exclusion area. This makes it possible to pin the functional layers at any desired position and thus to obtain high uniformity in the thickness of the functional layers.

EXAMPLES

A matrix of multiple anodes, each 190 μm×60 μm in size and 50 μm in thickness, was arranged on a glass substrate by sputtering. APC (Ag—Pd—Cu) alloy was employed as the anode material.

Linear bank (material: silicon oxide) was formed by CVD which surrounds the anodes formed on the substrate. The bank height was set at 1 μm, and bank taper angle was set at 45°. A lyophobic self-assembled film was formed over the bank surface and the region defined by the bank (anode surfaces). Portion of the self-assembled film was exposed to UV light through a mask at a dose of 8 J/cm². The exposure area was bank inclined side surface from the bottom to 600 nm height.

In the region defined by linear bank, a PEDOT-containing solution was applied and dried to form PEDOT layer (thickness: 65 nm) as hole injection layer. A 0.8 wt % triphenylamine solution in anisole was applied over the hole injection layer and dried to form thereon interlayer (thickness: 20 nm). A 1.3 wt % polyfluorene solution in cyclohexylbenzene was applied over the interlayers and dried to form thereon emitting layer (thickness: 85 nm). Further, electron injection layer (thickness: 5 nm) was formed over the emitting layer by vacuum deposition of barium.

A cathode (material: ITO, thickness: 100 nm) was formed over the electron injection layer by facing target sputtering. Finally, a sealing film was formed.

The present application claims the priority of Japanese Patent Application No. 2008-064818 filed on Mar. 13, 2008, the entire contents of which are herein incorporated by reference.

INDUSTRIAL APPLICABILITY

The present invention can improve uniformity of functional layers including organic emitting layers prepared using so-called coating methods, contributing to provide a high-quality organic EL display panel with less brightness unevenness.

EXPLANATION OF REFERENCE NUMERALS

1: Substrate
2: TFT
3: Planarizing film
4: Reflective anode
5: Hole injection layer
6: Interlayer
7: Emitting layer
8: Electron injection layer
9: Bank
9-1: Bank top surface
9-2: Bank inner side surface
9-3: Bank edge
10: Cathode
11: Sealing film
12: Lyophobic film
12': Lyophilic film
13: Pinning point
20: Substrate
21: Gate electrode
22: Gate insulating film
23: Source electrode
24: Drain electrode
25: Organic semiconductor layer
26: Bank
28: Overcoat layer
29: Lyophobic film
29': Lyophilic film
30: Pinning point
31: Mask
32: Irradiation light
40: Droplet
45: Effective pixel edge

The invention claimed is:

1. An organic EL display panel comprising a plurality of organic EL devices each including:
    a substrate;
    an anode formed over the substrate;
    an organic emitting layer formed over the anode, the organic emitting layer having a uniformly-thick area;
    a cathode formed over the organic emitting layer;
    a forward tapered bank defining a region for the organic emitting layer, the bank having a top surface and an inclined side surface, the bank being in contact with the anode and made entirely of organic insulating material; and
    a lyophobic organic film formed on the top surface of the bank and a upper portion of the inclined side surface of the bank, wherein
    a lower portion of the inclined side surface of the bank includes no lyophobic organic film, and
    the organic emitting layer is formed by a coating method,
    a contact point between a surface of the organic emitting layer, which surface faces the cathode, and the inclined side surface of the bank is at a boundary between a region with the lyophobic organic film and a region without the lyophobic organic film, and
    the contact point structured and arranged above the uniformly-thick area of the organic emitting layer.

2. The organic EL display panel according to claim 1, wherein the forward tapered bank has a taper angle of 20° to 70°.

3. The organic EL display panel according to claim 1, wherein the lyophobic organic film formed on the bank surface is a self-assembled film.

4. The organic EL display panel according to claim 1, wherein the lyophobic organic film formed on the bank surface is a monolayer film.

5. The organic EL display panel according to claim 1, further comprising a lyophilic organic film formed on the lower portion of the inclined side surface of the bank.

6. A method of manufacturing an organic EL display panel comprising:
    providing a substrate having a plurality of anodes formed thereon;
    forming a forward tapered bank having a top surface and an inclined side surface so as to surround at least a part of the anode, the bank being in contact with the anode and made entirely of organic insulating material;
    forming a lyophobic organic film over a surface of the bank;
    exposing the lyophobic organic film at a lower portion of the inclined side surface of the bank so as to reduce the lyophobicity of the exposed portion of the lyophobic organic film or remove the exposed portion of the lyophobic organic film;
    applying an ink containing organic luminescent material in a region defined by the bank to form therein an organic emitting layer having a uniformly-thick area; and
    forming a cathode over the organic emitting layer, wherein
    a contact point between a surface of the organic emitting layer, which surface faces the cathode, and the inclined side surface of the bank is at a boundary between a region with the lyophobic organic film and a region without the lyophobic organic film, and
    the contact point structured and arranged above the uniformly-thick area of the organic emitting layer.

7. The method according to claim 6, wherein the forward tapered bank has a taper angle of 20° to 70°.

8. The method according to claim 6, wherein the lyophobic organic film is a lyophobic, photosensitive self-assembled film.

9. The method according to claim 6, wherein light used for the exposure is UV light.

10. The method according to claim 6, further comprising forming a hole injection layer over the anode prior to the bank formation step.

* * * * *

UNITED STATES PATENT AND TRADEMARK OFFICE
CERTIFICATE OF CORRECTION

| | |
|---|---|
| PATENT NO. | : 8,130,177 B2 |
| APPLICATION NO. | : 12/677889 |
| DATED | : March 6, 2012 |
| INVENTOR(S) | : S. Nakatani et al. |

It is certified that error appears in the above-identified patent and that said Letters Patent is hereby corrected as shown below:

On Title page 2, column 2, line 2 of the printed patent, please delete duplicate reference "JP 200/0005056   1/2007".

Signed and Sealed this
Twenty-ninth Day of May, 2012

David J. Kappos
*Director of the United States Patent and Trademark Office*

UNITED STATES PATENT AND TRADEMARK OFFICE
CERTIFICATE OF CORRECTION

PATENT NO. : 8,130,177 B2
APPLICATION NO. : 12/677889
DATED : March 6, 2012
INVENTOR(S) : S. Nakatani et al.

It is certified that error appears in the above-identified patent and that said Letters Patent is hereby corrected as shown below:

On Title page 2, column 2, line 2 of the printed patent, please delete duplicate reference "JP 2007/0005056   1/2007".

This certificate supersedes the Certificate of Correction issued May 29, 2012.

Signed and Sealed this
Thirty-first Day of July, 2012

David J. Kappos
*Director of the United States Patent and Trademark Office*